United States Patent
Zabroda

(10) Patent No.: US 8,704,691 B2
(45) Date of Patent: Apr. 22, 2014

(54) TRACK-AND-HOLD CIRCUIT FOR ANALOG-TO-DIGITAL CONVERTER WITH SWITCHED CAPACITOR COUPLING OF AMPLIFIER STAGE

(75) Inventor: Oleksiy Zabroda, Constable, NY (US)

(73) Assignee: LSI Corporation, San Jose, CA (US)

(*) Notice: Subject to any disclaimer, the term of this patent is extended or adjusted under 35 U.S.C. 154(b) by 0 days.

(21) Appl. No.: 13/607,073

(22) Filed: Sep. 7, 2012

(65) Prior Publication Data

US 2014/0070971 A1 Mar. 13, 2014

(51) Int. Cl.
H03M 1/12 (2006.01)

(52) U.S. Cl.
USPC .......................................... 341/122; 341/155

(58) Field of Classification Search
USPC ......... 341/122, 155, 156, 159, 110, 118, 120; 330/9
See application file for complete search history.

(56) References Cited

U.S. PATENT DOCUMENTS 5,847,600 A * 12/1998 Brooks et al. ...................... 330/9
6,731,155 B2   5/2004 Hakkarainen et al.
8,279,100 B2 * 10/2012 Caci et al. ...................... 341/155
2012/0068766 A1  3/2012 Buter et al.

OTHER PUBLICATIONS

E. Sánchez-Sinencio et al., "CMOS Transconductance Amplifiers, Architectures and Active Filters: A Tutorial," IEEE Proceedings on Circuits, Devices and Systems, Feb. 2000, pp. 3-12, vol. 147, No. 1.
W. Yang et al., "A 3-V 340-mW 14-b 75-Msample/s CMOS ADC with 85-dB SFDR at Nyquist Input," IEEE Journal of Solid-State Circuits, Dec. 2001, pp. 1931-1936, vol. 36, No. 12.
C.-C. Hsu et al., "A 33-mW 12-Bit 100-MHz Sample-and-Hold Amplifier," Proceedings of the IEEE Asia-Pacific Conference on Application-Specific Integrated Circuit (ASIC), Aug. 2002, pp. 169-172.
Jipeng Li, "Accuracy Enhancement Techniques in Low-Voltage High-Speed Pipelined ADC Design," A Dissertation Submitted to Oregon State University in Partial Fulfillment of the Requirements for the Degree of Doctor of Philosophy, Oct. 2003, 131 pages.
D. Kelly et al., "A 3V 340mW 14b 75MSPS CMOS ADC with 85dB SFDR at Nyquist," IEEE International Solid-State Circuits Conference (ISSCC), Feb. 2001, pp. 134-135, 439.
Ronak Trivedi, "Low Power and High Speed Sample-and-Hold Circuit," 49th IEEE International Midwest Symposium on Circuits and Systems, Aug. 2006, pp. 453-456, vol. 1.

(Continued)

Primary Examiner — Joseph Lauture
(74) Attorney, Agent, or Firm — Ryan, Mason & Lewis, LLP

(57) ABSTRACT

A track-and-hold circuit comprises at least first and second amplifier stages, and switched capacitor circuitry coupled between the first and second amplifier stages. In a track mode of operation of the track-and-hold circuit, the switched capacitor circuitry is configured to decouple inputs of the second amplifier stage from respective outputs of the first amplifier stage and to couple the inputs of the second amplifier stage to a common mode voltage via respective first and second capacitors. In a hold mode of operation of the track-and-hold circuit, the switched capacitor circuitry is configured to couple the inputs of the second amplifier stage to the respective outputs of the first amplifier stage via the respective first and second capacitors. Multiple instances of the track-and-hold circuit may be implemented in parallel in a time-interleaved analog-to-digital converter.

21 Claims, 3 Drawing Sheets

(56) References Cited

OTHER PUBLICATIONS

B. Rahmatian et al., "A Low-Power 75dB Digitally Programmable CMOS Variable-Gain Amplifier," Canadian Conference on Electrical and Computer Engineering (CCECE), Apr. 2007, pp. 522-525.

J. Mahattanakul et al., "Selection of the Common-Mode Feedback Network Connection of Fully Differential Gm-C Filters," The Institution of Engineering and Technology Circuits, Devices & Systems, Feb. 2009, pp. 49-56, vol. 3, No. 1.

J. Cao et al., "A 500 mW ADC-Based CMOS AFE with Digital Calibration for 10 Gb/s Serial Links Over KR-Backplane and Multimode Fiber," IEEE Journal of Solid-State Circuits, Jun. 2010, pp. 1172-1185, vol. 45, No. 6.

C.-C. Hsu et al., "A CMOS 33-mW 100-MHz 80-dB SFDR Sample-and-Hold Amplifier," The Institute of Electronics, Information and Communication Engineers (IEICE) Transactions on Electronics, Jan. 2002, pp. 1-7, vol. E85-C, No, 1.

\* cited by examiner

TRACK MODE

HOLD MODE

TRACK-AND-HOLD CIRCUIT FOR ANALOG-TO-DIGITAL CONVERTER WITH SWITCHED CAPACITOR COUPLING OF AMPLIFIER STAGE

BACKGROUND

An analog-to-digital converter (ADC) converts an applied analog input signal into a digital output signal. ADCs find application in a wide variety of communication, storage and signal processing applications. Examples of different types of ADCs known to those skilled in the art include successive approximation register (SAR) ADCs, as well as other types of ADCs in which conversion is performed in multiple stages, such as pipelined ADCs and sub-ranging ADCs.

It is also known to implement a time-interleaved ADC as a combination of multiple ADCs operating in parallel, each of which may comprise a SAR ADC or other type of ADC. In one example of such an arrangement, m parallel n-bit ADCs each operate at a fractional sampling rate of $f_s/m$, where $f_s$ is the overall sampling rate of the time-interleaved ADC. The time-interleaved ADC produces an n-bit output at the sampling rate $f_s$ by interleaving the outputs of the m individual ADCs. The time-interleaved ADC generally includes an input track-and-hold circuit. The input track-and-hold circuit may be implemented using an amplifier, also commonly referred to as a sample-and-hold amplifier (SHA), which operates at the sampling rate $f_s$ and drives each of the m individual ADCs.

The SHA may be configured as a flip-around SHA with bottom-plate sampling, as described in, for example, C. Hsu et al., "A CMOS 33-mW 100-MHz 80-dB SFDR Sample-and-Hold Amplifier," IEICE Transactions on Electronics, Vol. E86-C, No. 10, pp. 2122-2128, October 2003, and R. Trivedi, "Low Power and High Speed Sample-and-Hold Circuit," 49th IEEE International Midwest Symposium on Circuits and Systems (MWSCAS '06), Aug. 6-9, 2006, pp. 453-456. Other examples of conventional SHAs are disclosed in U.S. Patent Application Publication No. 20120068766, entitled "Sample-and-Hold Amplifier.

The above-noted SHAs and other types of conventional track-and-hold circuits can be difficult to implement in practice due to the limited headroom provided for analog circuitry by modern CMOS processes. Also, with the short channel transistors generally used to meet high-speed requirements, it can be difficult to obtain sufficient gain within the track-and-hold circuit. This is particularly true for track-and-hold circuits in time-interleaved ADCs such as those that may be utilized in implementation of high-speed Serializer-Deserializer (SerDes) links in communication applications.

SUMMARY

Illustrative embodiments of the invention provide track-and-hold circuits that exhibit improved performance relative to conventional arrangements, thereby facilitating the implementation of time-interleaved ADCs in high-speed applications.

In one embodiment, a track-and-hold circuit comprises at least first and second amplifier stages, and switched capacitor circuitry coupled between the first and second amplifier stages. In a track mode of operation of the track-and-hold circuit, the switched capacitor circuitry is configured to decouple inputs of the second amplifier stage from respective outputs of the first amplifier stage and to couple the inputs of the second amplifier stage to a common mode voltage via respective first and second capacitors. The inputs of the second amplifier stage during the track mode of operation may also be coupled together as well as coupled directly to the common mode voltage, other than via the first and second capacitors. In a hold mode of operation of the track-and-hold circuit, the switched capacitor circuitry is configured to couple the inputs of the second amplifier stage to the respective outputs of the first amplifier stage via the respective first and second capacitors.

By way of example, the first and second amplifier stages may comprise respective main and auxiliary amplifier stages, with the auxiliary amplifier stage being configured in a positive feedback arrangement. One or both of the first and second amplifier stages may each be configured in the form of a differential operational transconductance amplifier. Moreover, at least the second amplifier stage may be configured as a gain calibration stage having an adjustable gain.

Embodiments of the invention can be implemented in time-interleaved ADCs as well as other types of ADCs. For example, in such an embodiment, multiple instances of the track-and-hold circuit may be arranged in parallel in a given time-interleaved ADC.

An ADC comprising at least one track-and-hold circuit in accordance with one or more embodiments of the invention may be implemented, for example, as a stand-alone device, such as a packaged integrated circuit, or as an embedded component of a SerDes device or other type of processing device.

DETAILED DESCRIPTION

Embodiments of the invention will be illustrated herein in conjunction with exemplary time-interleaved ADCs and associated track-and-hold circuits. It should be understood, however, that embodiments of the invention are more generally applicable to any ADC which can benefit from improved track-and-hold performance, and may be implemented using circuitry other than that specifically shown and described in conjunction with the various illustrative embodiments. It should also be noted that the term "track-and-hold circuit" as used herein is intended to be broadly construed, so as to encompass SHAs as well as other types and arrangements of circuitry configured with functionality for tracking and holding one or more input signal values. For example, embodiments of the invention may be adapted for use in any application requiring a sample-and-hold circuit, as well as in applications that track an analog signal during a sample time period and hold a maximum or minimum value of the analog signal that occurred during the sample time period.

Figure 1:
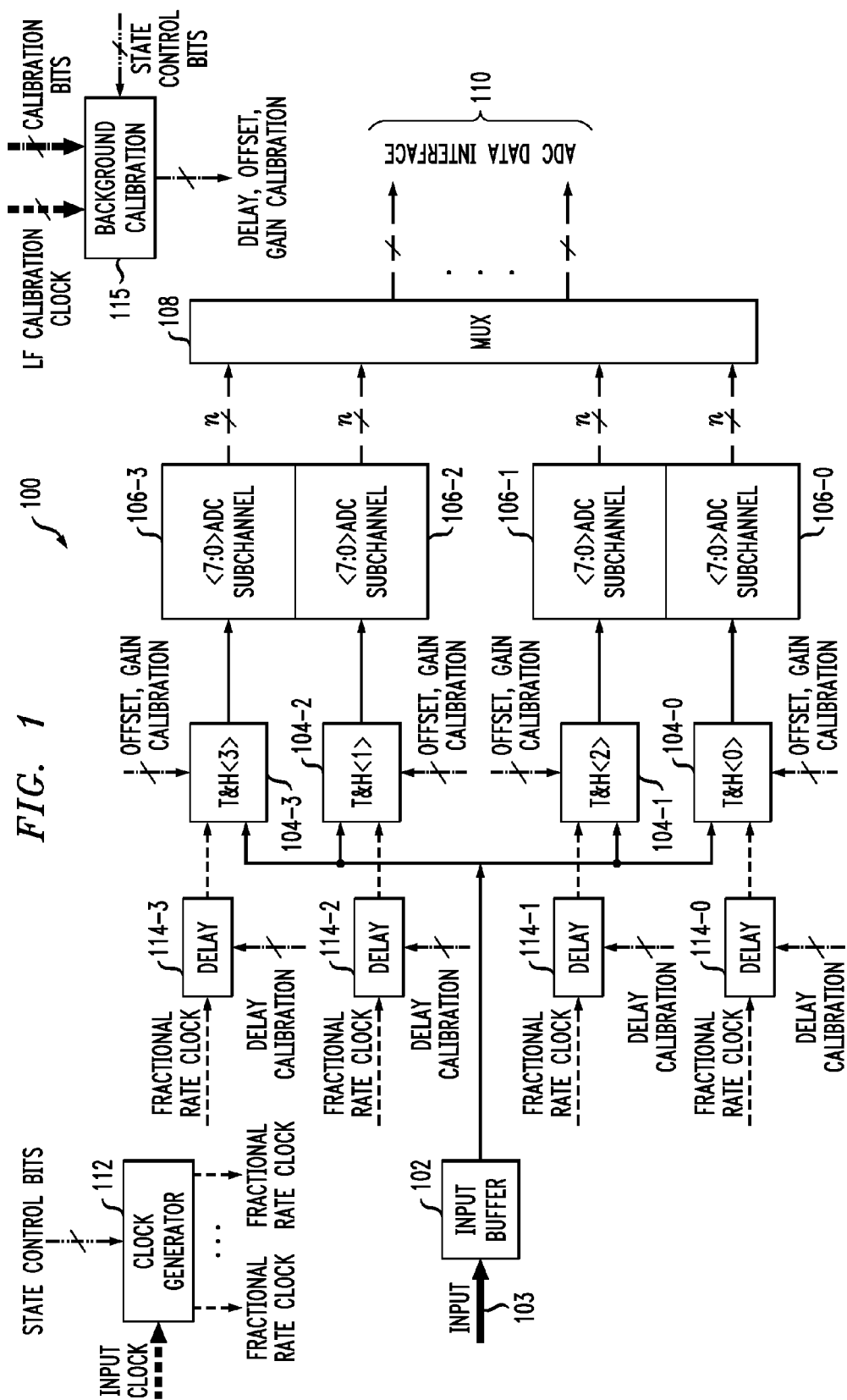
FIG. 1 is a block diagram of a time-interleaved ADC comprising multiple track-and-hold circuits in an illustrative embodiment of the invention.

FIG. 1 shows a block diagram of a time-interleaved ADC 100 in accordance with an illustrative embodiment of the invention. The time-interleaved ADC 100 comprises an input buffer 102 configured to receive an analog input signal via input signal line 103. The analog input signal is converted to a digital output signal by the ADC 100, which in the present embodiment includes four distinct subchannels, although different numbers of subchannels could be used in other embodiments. The ADC 100 further comprises four track-and-hold circuits 104-$i$, $i=0, 1, 2$ and 3, arranged in parallel with one another and each having an input coupled to an output of the buffer 102, four subchannel ADCs 106 each having an input coupled to an output of a corresponding one of the track-and-hold circuits 104, and a multiplexer 108 having a plurality of inputs coupled to respective outputs of the subchannel ADCs 106 and combining the outputs of the subchannel ADCs 106 in a time-interleaved manner.

The multiplexer 108 provides at its output 110 one or more n-bit digital output signals corresponding to the analog input signal converted to digital form. The subchannel ADCs are illustratively implemented as respective 8-bit ADCs each providing n=8 bits of digital output. The subchannel ADCs 106 may comprise respective SAR ADCs or other types of ADCs, in any combination. As a more particular example, a given one of the subchannel ADCs 106 may be implemented as a differential charge redistribution switched capacitor SAR ADC using a triple reference voltage, although numerous other ADC configurations may be used.

Each of the track-and-hold circuits 104 is clocked by a corresponding one of four fractional rate clocks provided by a clock generator 112. The clock generator 112 provides the fractional rate clocks by processing an input clock in a manner controlled by one or more state control bits. The fractional rate clocks prior to being applied to the respective track-and-hold circuits 104 pass through respective delay elements 114 which provide delay adjustment based on delay calibration signals.

In the present embodiment, each of the four ADCs 106 of the respective subchannels of the time-interleaved ADC 100 operates at a fractional sampling rate of $f_s/4$, where $f_s$ is the overall sampling rate of the ADC 100. The four different fractional rate clocks associated with the respective subchannels ADCs are each shifted relative to one another by a cycle of the full rate input clock.

The track-and-hold circuits 104 also receive input offset and gain calibration signals as indicated. The delay calibration signals applied to delay elements 114 and the offset and gain calibration signals provided to the track-and-hold circuits 104 are generated by a background calibration module 115, which receives as its inputs a low frequency (LF) calibration clock, calibration bits, and state control bits. These and other input signals processed in the ADC 100 may be supplied to the ADC 100 from an associated processor or other external circuitry.

As will be described in greater detail below in conjunction with FIGS. 2 and 3, the track-and-hold circuits 104 in the present embodiment each comprise main and auxiliary amplifier stages, with an input of the auxiliary amplifier stage being coupled to an output of the main amplifier stage, and with the auxiliary amplifier stage being configured in a positive feedback arrangement.

The time-interleaved ADC 100 as illustrated in FIG. 1 may include other elements in addition to or in place of those specifically shown, including one or more elements of a type commonly found in a conventional implementation of such a device. These and other conventional elements, being well understood by those skilled in the art, are not described in detail herein. It should also be understood that the particular arrangement of elements shown in FIG. 1 is presented by way of illustrative example only. Those skilled in the art will recognize that a wide variety of other device configurations may be used in implementing embodiments of the invention. For example, embodiments of the invention need not utilize time interleaving, and could therefore include only a single track-and-hold circuit, rather than multiple track-and-hold circuits for respective subchannels as in the FIG. 1 embodiment. Also, as indicated previously, different numbers of subchannels may be used to implement time interleaving in other embodiments. Embodiments of the invention with time interleaving are therefore not restricted to use with any particular number of subchannels.

Figure 2A:
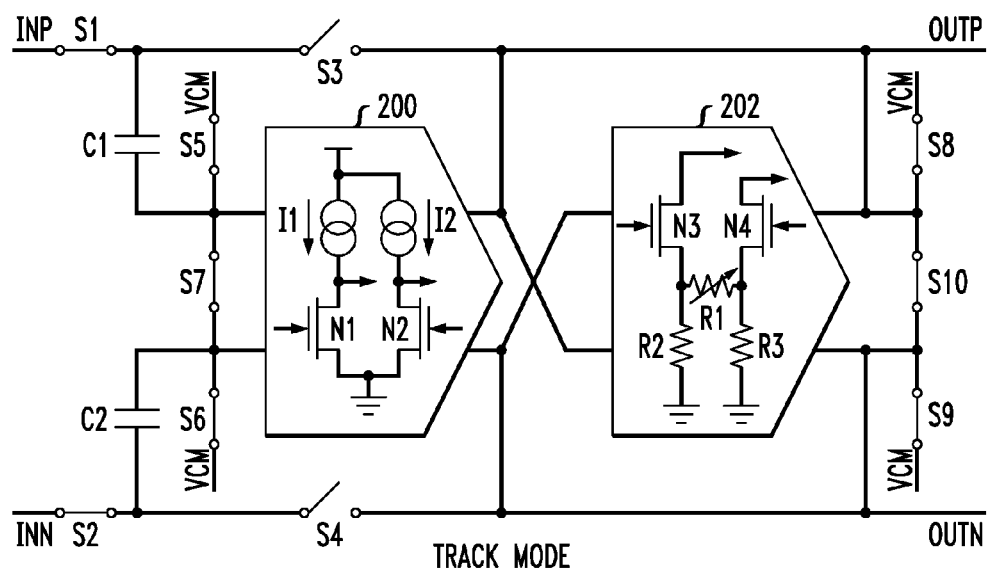
FIGS. 2A and 2B show respective schematic diagrams of a given track-and-hold circuit of the FIG. 1 ADC with direct coupling between a main amplifier stage and an auxiliary amplifier stage, in a track mode of operation and a hold mode of operation.
Figure 2B:
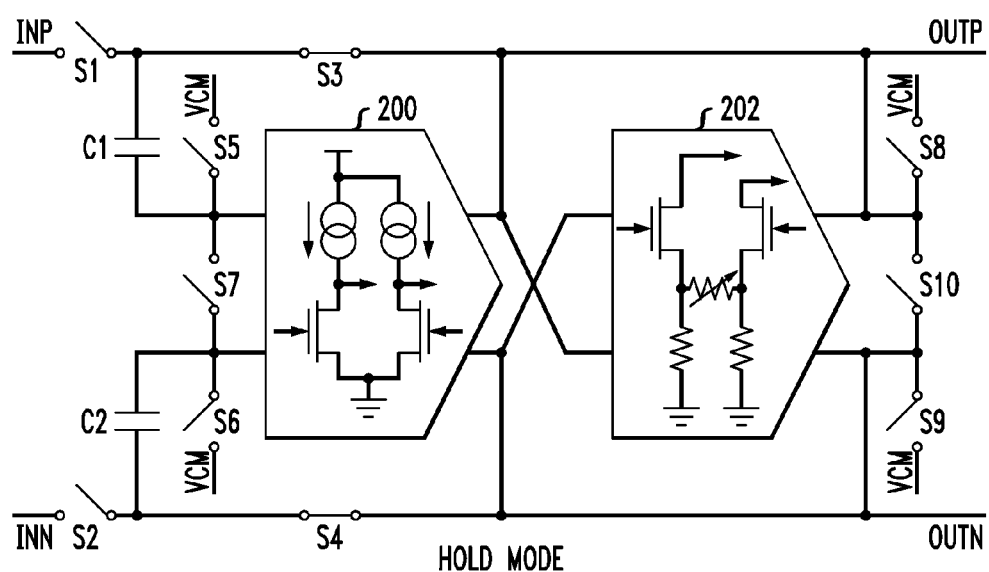

Referring now to FIGS. 2A and 2B, a given track-and-hold circuit 104-$i$ of the ADC 100 is shown in greater detail, in respective track and hold operating modes. In this embodiment, the track-and-hold circuit 104-$i$ comprises a main amplifier stage 200 and an auxiliary amplifier stage 202, with direct coupling between the main and auxiliary amplifier stages. Both the main and auxiliary amplifier stages 200 and 202 are implemented as differential operational transconductance amplifiers, and the main stage 200 more particularly comprises a flip-around SHA with bottom-plate sampling, although other types of amplifiers could be used in other embodiments.

Inputs of the auxiliary amplifier stage 202 are coupled to corresponding outputs of main amplifier stage 200. More particularly, in this embodiment, the positive and negative differential outputs of the main amplifier stage 200 are cross-coupled to respective negative and positive differential inputs of the auxiliary amplifier stage 202. Also, the auxiliary amplifier stage 202 is configured in a positive feedback arrangement, and serves as a gain calibration stage for the track-and-hold circuit 104-$i$.

The main amplifier stage 200 comprises first and second current sources I1 and I2 that drive respective N-type metal-oxide-semiconductor (NMOS) transistors N1 and N2. The current sources I1 and I2 are coupled between the respective drain terminals of N1 and N2 and an upper supply voltage. The sources of N1 and N2 are coupled together and to a lower supply voltage, illustratively ground potential. Differential inputs of the main amplifier stage drive respective gate terminals of N1 and N2, and differential outputs of the main amplifier stage are driven by respective drain terminals of N1 and N2.

The auxiliary amplifier stage 202 similarly comprises a differential stage including first and second NMOS transistors N3 and N4. However, in this stage, transconductance is degenerated by a variable resistor R1 connected between the sources of the transistors N3 and N4. The variable resistor R1 provides a gain control mechanism in the auxiliary amplifier stage, as will be described in greater detail below. The sources of N3 and N4 are also coupled to ground potential via respective resistors R2 and R3. Differential inputs of the auxiliary amplifier stage drive respective gate terminals of N3 and N4, and differential outputs of the auxiliary amplifier stage are driven by respective drain terminals of N3 and N4.

The track-and-hold circuit 104-$i$ further includes, in addition to the main and auxiliary amplifier stages 200 and 202, capacitors C1 and C2 and switches S1 through S10. Switches S1 and S2 are coupled between respective positive and negative differential inputs INP and INN of the track-and-hold circuit and respective upper plates of the capacitors C1 and C2. The lower plates of the capacitors C1 and C2 are coupled to the respective positive and negative differential inputs of the main amplifier stage 200.

The switches S3 and S4 are coupled between the respective upper plates of the capacitors C1 and C2 and respective positive and negative differential outputs OUTP and OUTN of the track-and-hold circuit.

The switches S5 and S6 are coupled between the respective positive and negative inputs of the main amplifier stage 200 and a common mode voltage VCM, and the switch S7 is coupled between the positive and negative inputs of the main amplifier stage 200.

The switches S8 and S9 are coupled between the respective positive and negative outputs of the auxiliary amplifier stage 202 and the common mode voltage VCM, and the switch S10 is coupled between the positive and negative outputs of the auxiliary amplifier stage 202.

In the track mode of operation, illustrated in FIG. 2A, switches S1, S2 and S5-S10 are closed, and switches S3 and S4 are open. Thus, the inputs of the main amplifier stage 200 are shunted together and tied to the common mode voltage VCM via switches S5 to S7. Similarly, the outputs of the auxiliary amplifier stage 202 are shunted together and tied to the common mode voltage VCM via switches S8 to S10. The capacitors C1 and C2 follow the differential input voltage at inputs INP and INN via respective switches S1 and S2. The inputs INP and INN are isolated from the outputs OUTP and OUTN via switches S3 and S4.

In the hold mode of operation, illustrated in FIG. 2B, switches S1, S2 and S5-S10 are open, and switches S3 and S4 are closed. When switches 51, S2 and S5-S7 transition from closed to open, the differential input voltage is sampled by capacitors C1 and C2. Also, capacitors C1 and C2 are connected between the inputs and outputs of the main amplifier stage 200 via respective switches S3 and S4, such that the voltage drop across the main amplifier outputs is approximately equal to the differential input voltage sampled by the capacitors. Assuming that the main amplifier stage 200 has a finite open loop gain, the output voltage differs from the sampled input voltage by a factor of:

$$\frac{A}{A+1}$$

where A in this case denotes the open loop gain of the main amplifier stage.

Since modern short channel MOS transistors are typically not capable of providing high gain, the output voltage of a track-and-hold circuit may undergo a substantial attenuation relative to the input voltage. Also, because gain can vary from transistor to transistor, track-and-hold circuits used in a time-interleaved ADC configuration may demonstrate different levels of attenuation. Thus, the gains of the individual track-and-hold circuits are calibrated, as illustrated in FIG. 1.

As noted previously, the auxiliary amplifier 202 is coupled in a positive feedback configuration. The depth of the positive feedback is controlled by a variable resistor R1 connected between the sources of transistors of N3 and N4 of the auxiliary amplifier, which can be used to significantly increase the effective open loop gain of the combined amplifier stages. More particularly, by increasing the positive feedback depth via adjustment of variable resistor R1, the effective open loop gain of the combined stages can be made very high, such that:

$$\frac{A}{A+1} \approx 1$$

where A in this case denotes the open loop gain of the combined main and auxiliary amplifier stages.

It should be noted that configuring the auxiliary amplifier stage 202 with positive feedback does not compromise the stability of the track-and-hold circuit. This is because the capacitors C1 and C2 are configured to establish full negative feedback within the track-and-hold circuit, which in terms of stability impact tends to override the positive feedback established by the auxiliary amplifier stage. Also, numerous other types of circuitry may be used to provide a positive feedback configuration for the auxiliary amplifier stage 202, as will be appreciated by those skilled in the art.

In the embodiment described above in conjunction with FIGS. 2A and 2B, direct coupling is used between the main and auxiliary amplifier stages 200 and 202. However, in implementations in which the threshold voltages of the MOS transistors used in the auxiliary amplifier stage 202 are not sufficiently small, and a relatively low power supply voltage value is used, the common mode voltage achievable at the output of the main amplifier stage 200 may be insufficient to support proper operation of the auxiliary amplifier stage. Accordingly, other embodiments of the present invention utilize switched capacitor coupling between the main amplifier stage and the auxiliary amplifier stage, as will now be described in conjunction with FIGS. 3A and 3B.

Figure 3A:
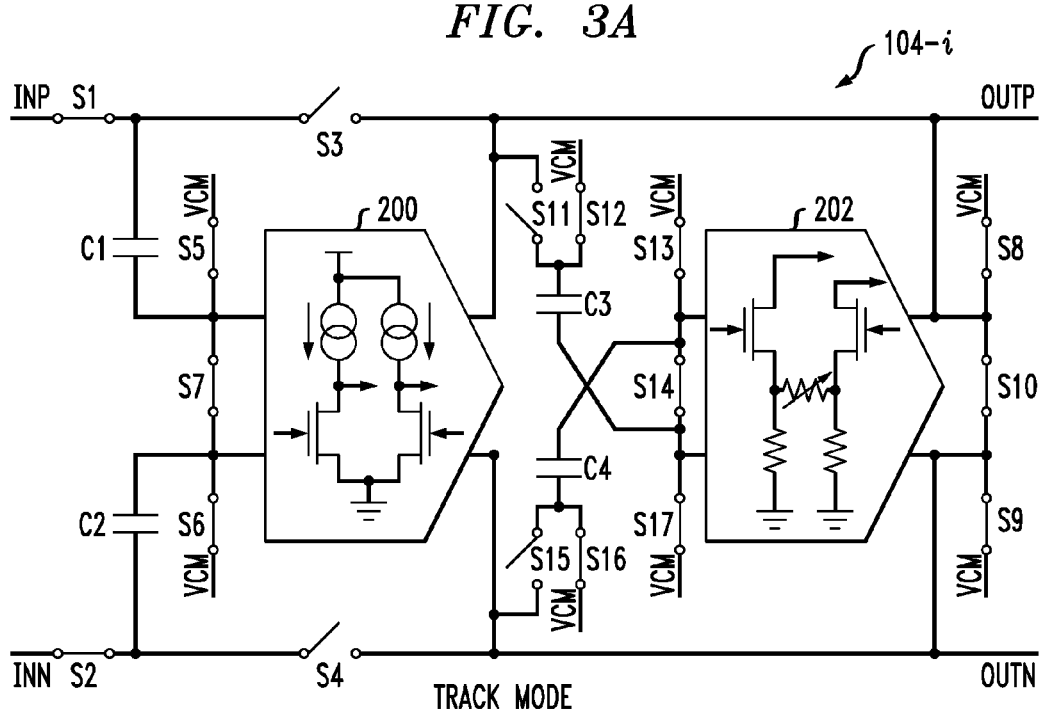
FIGS. 3A and 3B show respective schematic diagrams of a given track-and-hold circuit of the FIG. 1 ADC with switched capacitor coupling between a main amplifier stage and an auxiliary amplifier stage, in a track mode of operation and a hold mode of operation.
Figure 3B:
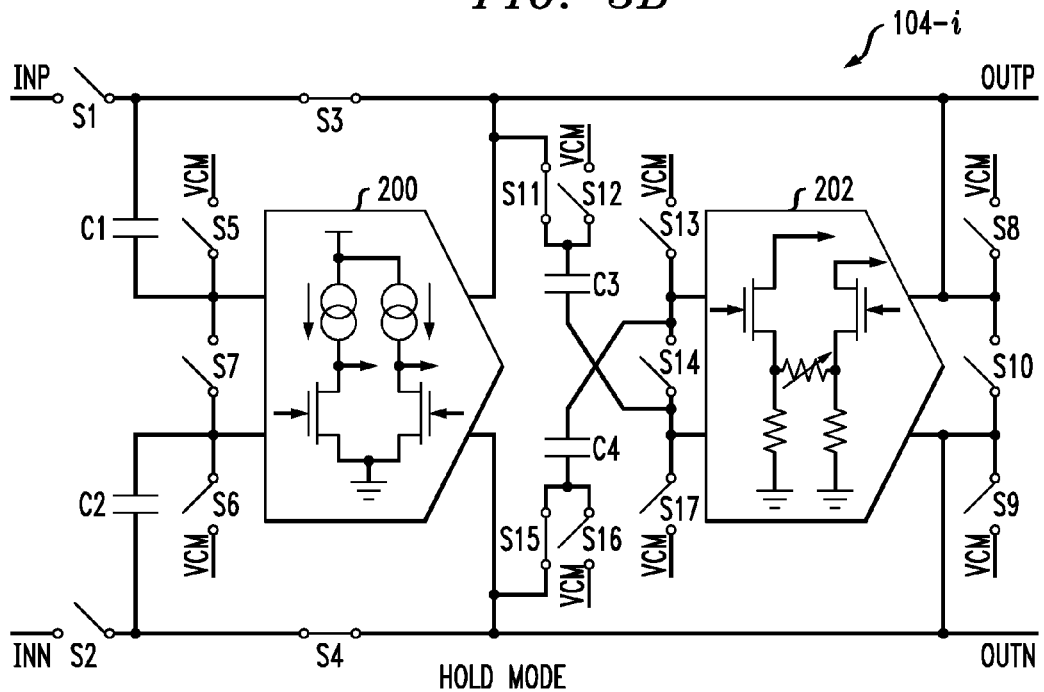

The track-and-hold circuit 104-$i$ as illustrated in FIGS. 3A and 3B includes, in addition to the main and auxiliary amplifier stages 200 and 200, capacitors C1 and C2 and switches S1 through S10, configured to operate substantially as previously described. Also, the track-and-hold circuit comprises switched capacitor circuitry coupled between the first and second amplifier stages, with the switched capacitor circuitry in this embodiment comprising additional capacitors C3 and C4 and additional switches S11 through S17.

Switch S11 is coupled between the positive output of the main amplifier stage 200 and an upper plate of the capacitor C3, switch S12 is coupled between the upper plate of the capacitor C3 and the common mode voltage VCM, and switch S13 is coupled between the positive input of the auxiliary amplifier stage 202 and the common mode voltage VCM. A lower plate of the capacitor C3 is coupled to the negative input of the auxiliary amplifier stage.

Similarly, switch S15 is coupled between the negative output of the main amplifier stage 200 and an upper plate of the capacitor C4, switch S16 is coupled between the upper plate of the capacitor C4 and the common mode voltage VCM, and switch S17 is coupled between the negative input of the auxiliary amplifier stage 202 and the common mode voltage VCM. A lower plate of the capacitor C4 is coupled to the positive input of the auxiliary amplifier stage.

Also, switch S14 is coupled between the positive and negative inputs of the auxiliary amplifier stage 202.

In the track mode of operation, illustrated in FIG. 3A, switches S1, S2, S5-S10, S12-S14, S16 and S17 are closed, and switches S3, S4, S11 and S15 are open. As a result, the positive and negative outputs of the main amplifier stage 200 are disconnected from the respective negative and positive inputs of the auxiliary amplifier stage 202, via respective open switches S11 and S15. Thus, in the track mode of operation, the positive and negative differential outputs of the main amplifier stage 200 that would otherwise normally be coupled to the respective negative and positive differential inputs of the auxiliary amplifier stage 202 are instead decoupled from those inputs.

In addition, the inputs of the auxiliary amplifier stage 202 are coupled to the common mode voltage VCM via corresponding capacitors C3 and C4 and switches S12 and S16. Moreover, the inputs of the auxiliary amplifier stage 202 are directly coupled to the common mode voltage VCM via switches S13 and S17, and are coupled together via switch S14.

Accordingly, in the track mode of operation, the inputs of the auxiliary amplifier stage 202 are decoupled from the corresponding outputs of the main amplifier stage 200 by the switched capacitor circuitry comprising additional switches S11 to S17 and additional capacitors C3 and C4.

In the hold mode of operation, illustrated in FIG. 3B, switches S1, S2, S5-S10, S12-S14, S16 and S17 are open, and switches S3, S4, S11 and S15 are closed. As a result, the positive and negative outputs of the main amplifier stage 200 are coupled to the respective negative and positive inputs of the auxiliary amplifier stage 202, via respective closed switches S11 and S15 and respective capacitors C3 and C4. Accordingly, during the hold mode the additional capacitors C3 and C4 couple the negative and positive inputs of the auxiliary amplifier stage 202 to the respective positive and negative outputs OUTP and OUTN, thereby establishing the desired feedback configuration.

In one possible implementation of the FIG. 3 circuitry, the values of capacitors C1 and C2 may each be approximately 45 femtoFarads (fF), and the values of capacitors C3 and C4 may each be approximately 25 fF. These capacitor values may be chosen based on a particular ADC resolution (e.g., 6b) and a particular track-and-hold input dynamic range (e.g., 300 mV p-p). Every additional bit of ADC resolution or 6 dB reduction in track-and-hold input dynamic range may involve increasing the values of the capacitors by a factor of four. Variable resistor R1 may be implemented using an NMOS transistor and may be configured to vary in a range from about 500 Ohms to a very high or essentially infinite value. Resistors R2 and R3 may be about 320 Ohms each. Of course, the above capacitor and resistor values are exemplary only, and other values may be used in other embodiments.

The illustrative track-and-hold circuits described above are simpler to implement than conventional circuits within the limited headroom provided for analog circuitry by modern CMOS processes. Moreover, the disclosed arrangements facilitate the provision of substantial amounts of additional gain relative to conventional arrangements, and are therefore well-suited for use in high-speed applications involving short channel transistors.

It is to be appreciated that the particular circuitry configurations illustrated in FIGS. 1 through 3 are presented by way of illustrative example only, and other embodiments may use other types and arrangements of circuitry.

For example, in one or more of these other embodiments, the conductivity types of at least a subset of the MOS transistors of the circuitry may be reversed, and other suitable modifications may be made to the circuitry, control signals and associated signaling levels, as would be appreciated by one skilled in the art.

Embodiments of the invention are particularly well suited for use in high-speed SerDes devices, as well as other types of processing devices that demand very low BER performance. Such processing devices may include, for example, computers, servers or portable communication devices such as mobile telephones.

A given ADC configured in accordance with an embodiment of the invention may be implemented as a stand-alone device, for example, as a packaged integrated circuit device suitable for incorporation into a higher-level circuit board or other system. Other types of implementations are possible, such as an embedded device, where the ADC may be, for example, embedded into a processor or other type of integrated circuit device which comprises additional circuitry coupled to the ADC. More particularly, an ADC as described herein may comprise, for example, an embedded device implemented within a microprocessor, digital signal processor (DSP), application-specific integrated circuit (ASIC), field-programmable gate array (FPGA) or other type of processor or integrated circuit device.

As indicated above, embodiments of the invention may be implemented in the form of integrated circuits. In fabricating such integrated circuits, identical die are typically formed in a repeated pattern on a surface of a semiconductor wafer. Each die may include an ADC or portion thereof, comprising one or more track-and-hold circuits as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

Again, it should be emphasized that the above-described embodiments of the invention are intended to be illustrative only. For example, other embodiments can use different types and arrangements of amplifier stages, switched capacitor circuitry, circuit elements, direct or switched inter-stage coupling, negative and positive feedback, operating modes, transistor conductivity types, control signals, and other elements for implementing the described functionality. These and numerous other alternative embodiments within the scope of the following claims will be apparent to those skilled in the art.

What is claimed is:

1. A track-and-hold circuit comprising:
   at least first and second amplifier stages; and
   switched capacitor circuitry coupled between the first and second amplifier stages;
   wherein in a track mode of operation of the track-and-hold circuit the switched capacitor circuitry is configured to decouple inputs of the second amplifier stage from respective outputs of the first amplifier stage and to couple the inputs of the second amplifier stage to a common mode voltage via respective first and second capacitors; and
   wherein in a hold mode of operation of the track-and-hold circuit the switched capacitor circuitry is configured to couple the inputs of the second amplifier stage to the respective outputs of the first amplifier stage via the respective first and second capacitors.

2. The apparatus of claim 1 wherein the first and second amplifier stages comprise respective main and auxiliary amplifier stages, with an input of the auxiliary amplifier stage being coupled to an output of the main amplifier stage, and the auxiliary amplifier stage being configured in a positive feedback arrangement.

3. The apparatus of claim 1 wherein at least one of the first and second amplifier stages comprises a differential operational transconductance amplifier.

4. The apparatus of claim 1 wherein the outputs of the first amplifier stage comprise respective positive and negative differential outputs and the inputs of the second amplifier stage comprise respective negative and positive differential inputs.

5. The apparatus of claim 4 wherein in the track mode of operation the positive and negative differential outputs of the first amplifier stage that would otherwise normally be coupled to the respective negative and positive differential inputs of the second amplifier stage are instead decoupled from those inputs.

6. The apparatus of claim 4 wherein in the hold mode of operation the positive and negative differential outputs of the first amplifier stage are coupled to the respective negative and positive differential inputs of the second amplifier stage via the respective first and second capacitors.

7. The apparatus of claim 1 wherein the switched capacitor circuitry comprises:
a first switch coupled between a positive output of the first amplifier stage and an upper plate of the first capacitor;
a second switch coupled between the upper plate of the first capacitor and the common mode voltage; and
a third switch coupled between a positive input of the second amplifier stage and the common mode voltage;
wherein a lower plate of the first capacitor is coupled to a negative input of the second amplifier stage.

8. The apparatus of claim 7 wherein the switched capacitor circuitry further comprises a fourth switch coupled between the positive and negative inputs of the second amplifier stage.

9. The apparatus of claim 8 wherein the switched capacitor circuitry further comprises:
a fifth switch coupled between a negative output of the first amplifier stage and a lower plate of the second capacitor;
a sixth switch coupled between the lower plate of the second capacitor and the common mode voltage; and
a seventh switch coupled between the negative input of the second amplifier stage and the common mode voltage;
wherein an upper plate of the second capacitor is coupled to the positive input of the second amplifier stage.

10. The apparatus of claim 9 wherein in the track mode of operation, the first and fifth switches are open, and the second, third, fourth, sixth and seventh switches are closed, and wherein in the hold mode of operation, the first and fifth switches are closed, and the second, third, fourth, sixth and seventh switches are open.

11. The apparatus of claim 1 wherein the second amplifier stage comprises a gain calibration stage having an adjustable gain.

12. The apparatus of claim 1 wherein the inputs of the second amplifier stage during the track mode of operation are coupled together as well as coupled directly to the common mode voltage other than via the first and second capacitors.

13. The track-and-hold circuit of claim 1 wherein the track-and-hold circuit is implemented in the form of an integrated circuit.

14. An analog-to-digital converter comprising the track-and-hold circuit of claim 1.

15. A processing device comprising the analog-to-digital converter of claim 14.

16. The processing device of claim 15 wherein the processing device comprises a serializer-deserializer that incorporates the analog-to-digital converter.

17. A track-and-hold circuit comprising:
at least first and second amplifier stages;
wherein the first and second amplifier stages comprise respective main and auxiliary amplifier stages, with an input of the auxiliary amplifier stage being coupled to an output of the main amplifier stage, and the auxiliary amplifier stage being configured in a positive feedback arrangement; and
wherein positive and negative inputs of the auxiliary amplifier stage are coupled to respective negative and positive outputs of both the main amplifier stage and the auxiliary amplifier stage.

18. The track-and-hold circuit of claim 17, wherein the auxiliary amplifier stage comprises first and second transistors and a variable resistor connecting sources of the first and second transistors, and wherein a depth of the positive feedback is controlled by the variable resistor.

19. A method comprising:
in a track mode of operation of a track-and-hold circuit comprising at least first and second amplifier stages, decoupling inputs of the second amplifier stage from respective outputs of the first amplifier stage, and coupling the inputs of the second amplifier stage to a common mode voltage via respective first and second capacitors; and
in a hold mode of operation of the track-and-hold circuit, coupling the inputs of the second amplifier stage to the respective outputs of the first amplifier stage via the respective first and second capacitors.

20. The method of claim 19 wherein in the track mode of operation, positive and negative differential outputs of the first amplifier stage that would otherwise normally be coupled to respective negative and positive differential inputs of the second amplifier stage are instead decoupled from those inputs, and wherein in the hold mode of operation, positive and negative differential outputs of the first amplifier stage are coupled to respective negative and positive differential inputs of the second amplifier stage via the respective first and second capacitors.

21. A time-interleaved analog-to-digital converter comprising:
a buffer configured to receive an analog input signal;
a plurality of track-and-hold circuits arranged in parallel with one another and each having an input coupled to an output of the buffer;
a plurality of analog-to-digital converters each having an input coupled to an output of a corresponding one of the track-and-hold circuits; and
a multiplexer having a plurality of inputs coupled to respective outputs of the analog-to-digital converters and combining the outputs of the analog-to-digital converters in a time-interleaved manner;
wherein at least a given one of the track-and-hold circuits comprises:
at least first and second amplifier stages; and
switched capacitor circuitry coupled between the first and second amplifier stages;
wherein in a track mode of operation of the given track-and-hold circuit the switched capacitor circuitry is configured to decouple inputs of the second amplifier stage from respective outputs of the first amplifier stage and to couple the inputs of the second amplifier stage to a common mode voltage via respective first and second capacitors; and
wherein in a hold mode of operation of the given track-and-hold circuit the switched capacitor circuitry is configured to couple the inputs of the second amplifier stage to the respective outputs of the first amplifier stage via the respective first and second capacitors.

* * * * *